United States Patent [19]

Schreck et al.

[11] Patent Number: 4,760,554
[45] Date of Patent: Jul. 26, 1988

[54] STAGGERED CONTACTS IN ARRAYS OF PROGRAMMABLE MEMORY CELLS

[75] Inventors: John F. Schreck, Houston; Timmie M. Coffman, Sugar Land, both of Tex.

[73] Assignee: Texas Instruments Incorporated, Dallas, Tex.

[21] Appl. No.: 900,059

[22] Filed: Aug. 15, 1986

[51] Int. Cl.⁴ .............................................. G11C 13/00
[52] U.S. Cl. ....................................... 365/51; 365/189
[58] Field of Search ........................... 365/51, 189, 230

[56] References Cited

U.S. PATENT DOCUMENTS 4,481,609 11/1984 Higuchi et al. ........................ 365/51
4,627,028 12/1986 Monk ..................................... 365/51

Primary Examiner—Terrell W. Fears
Attorney, Agent, or Firm—John G. Graham; Theodore D. Lindgren

[57] ABSTRACT

An array of programmable memory cells having spaced apart bit lines, spaced conducting word lines crossing over the bit lines and electrically conductive lead lines crossing over the word line which includes electrically conductive contacts between lead lines and corresponding bit lines. Each contact is located at an opposite side of a selected number of word lines to contacts between adjacent lead lines and associated bit lines so that when viewed in plan the contacts are staggered from one lead line to the next.

6 Claims, 2 Drawing Sheets

STAGGERED CONTACTS IN ARRAYS OF PROGRAMMABLE MEMORY CELLS

BACKGROUND OF THE INVENTION

The present invention relates to contacts to bit lines in an array of programmable memory cells.

In forming contacts to source/drain bit lines in an array of programmable memory cells ordinarily contacts are made to each bit line after every 16 word lines. It has been observed experimentally that the programmability of cells in such an array varies depending on the position of the word line relative to the contacts. Transistors having word lines close to the contacts have higher programming current than those further removed from the contacts. Obviously, it is desirable to have a more uniform programming response which is independent of the position of a word line for a transistor relative to the bit line contacts.

Accordingly, it is a principal object of the invention to provide improved bit line contacts in an array of programmable memory cells.

SUMMARY OF THE INVENTION

According to the invention there is provided an array of programmable memory cells having spaced apart bit lines, spaced conducting word lines crossing over the bit lines and electrically conductive lead lines crossing over the word line which includes electrically conductive contacts between lead lines and corresponding bit lines. Each contact is located at an opposite side of a selected number of word lines to contacts between adjacent lead lines and associated bit lines so that when viewed in plan the contacts are staggered from one lead line to the next.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
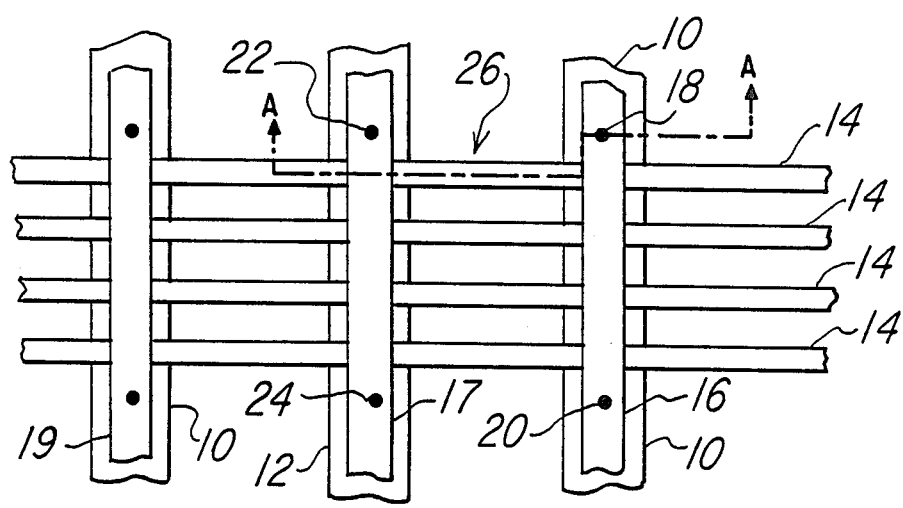
FIG. 1 is a top view, greatly enlarged of an array of programmable memory cells showing the bit lines, the word lines, the bit line leads and contacts between the bit line leads and the bit lines according to the prior art.
Figure 2:
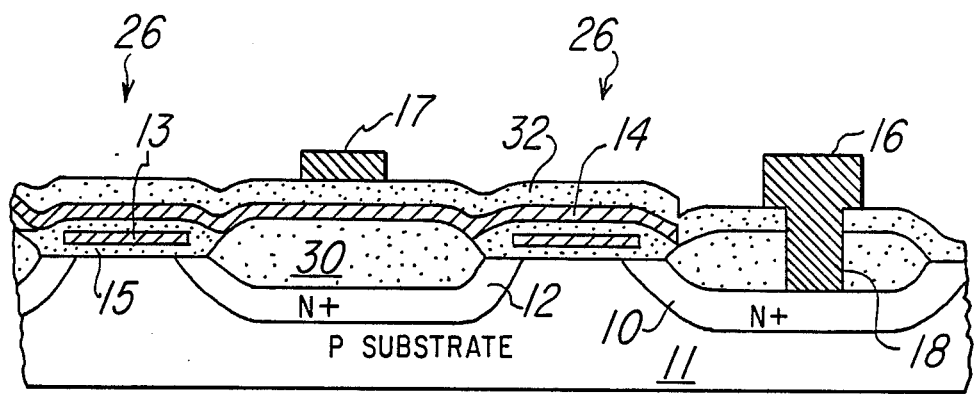
FIG. 2 is a cross-sectional profile of an electrically programmable memory cell taken along the line a—a of FIG. 1.

Referring to FIG. 1, there is shown in top view a small portion of an array of programmable memory cells which shows source and drain bit lines 10 and 12, respectively, formed in the semiconductor substrate 11 (see FIG. 2). Crossing over each bit line 10, 12 are regularly spaced apart polysilicon word lines 14 which function as the control gate of a floating gate transistor 26. Under each word line 14 as seen in FIG. 2 is a polysilicon floating gate 13 separated from the face of the substrate 11 by a thin gate oxide 15. Metal lead lines 16, 17 and 19 run parallel to the bit lines 10 and 12 crossing over the word lines 14. Each lead 16 and 17 makes contact with an underlying bit line 10 and 12, respectively, by contacts 18, 20, 22 and 24 after a predetermined number of word lines shown as 4 but which is usually 16. An insulator cap 32 such as phosphosilicate glass is used to cap the polysilicon lines 14 with openings being patterned and etched in the latter and aluminum deposited in the holes to form contacts 18, 20, 22 and 24. The bit lines which are the sources 10 and drains 12 of transistors 26 are buried below thick field oxide layers 30.

Figure 3:
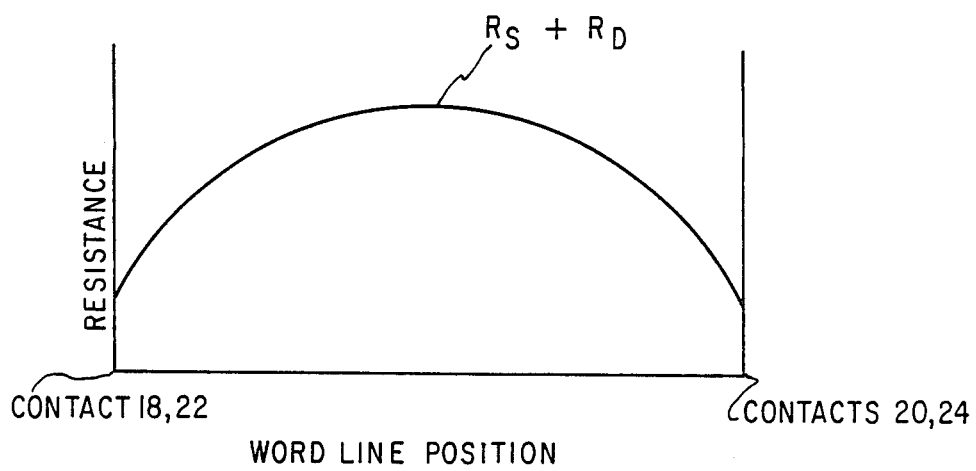
FIG. 3 is an experimental measurement of the total programming resistance of the source and drain in progressing along a group of word lines from one set of contacts to a next in the circuit of FIG. 1.

Experimental measurements of the total source to drain programming resistance gives a curve such as that shown in FIG. 3 in which the resistance is lowest near the contacts and increases to a maximum halfway between sets of contacts 18, 22 and 20, 24.

Figure 4:
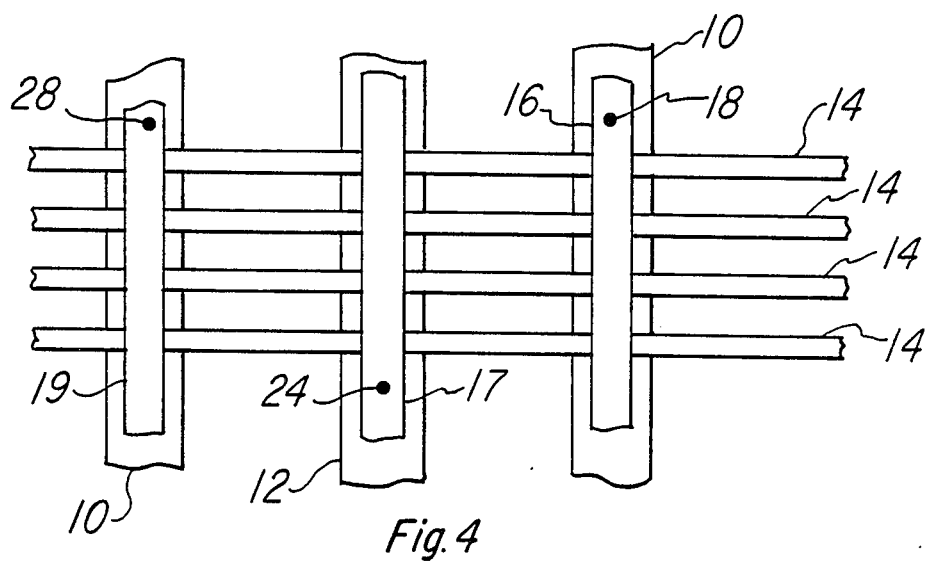
FIG. 4 is a top view, greatly enlarged, of an array as in FIG. 1 but with the contacts staggered in accordance with the invention.

A layout which considerably reduces the variation in source and drain resistance is that shown in FIG. 4 in which contacts 18 and 24 are staggered from one lead line 18 to another 17. The remaining references shown in FIG. 4 refer to like elements as those of the same reference numbers shown in FIG. 1. In this case the total length of source and drain bit line from each transistor to contact pairs such as 18 and 24 is the same regardless of which word line 14 selected. In this case the resistance contributed by each bit line will have the shape of that of FIG. 3 and the curve for each bit line will have the same shape and magnitude but will be shifted so that its minimum will be in line with the maximum of an adjacent bit line. Thus, the two curves compensate each other and give a relatively flat combined source and drain resistance curve. The latter arrangement provides a more uniform response to programming.

Other variations, modifications and departures lying within the spirit of the invention or scope as defined by the appended claims will be obvious to those skilled in the art.

What is claimed is:

1. An array of electrical connections for programmable memory cells having spaced apart source/drain bit lines, spaced apart electrically conducting word lines crossing over the bit lines and spaced apart electrically conducting lead lines corresponding to and running parallel to said bit lines, said lead lines crossing over said word lines, said array having electrically conducting contact between each said lead line and each said corresponding bit line wherein each contact is located a selected number of word lines from the nearest adjacent contact between each said lead and bit line, comprising:
   said contacts between each said lead line and bitline positioned at points located substantially one-half of said selected number of word lines from the corresponding contacts of each adjacent lead line and bit line.

2. An array according to claim 1, wherein said word lines are doped polysilicon, said lead lines are metal and said bit lines are doped regions formed in a semiconductor substrate of a first conductivity type.

3. An array according to claim 1, wherein said memory cells are electrically programmable read only memory cells.

4. An array according to claim 2, wherein said doped regions are N+ type conductivity regions.

5. An array according to claim 1, wherein said word lines are regularly spaced.

6. An array according to claim 1, wherein the number of word lines between each adjacent contact is 16.

* * * * *